(12) United States Patent
Chen et al.

(10) Patent No.: US 6,238,963 B1
(45) Date of Patent: May 29, 2001

(54) DAMASCENE PROCESS FOR FORMING FERROELECTRIC CAPACITORS

(75) Inventors: Bomy A. Chen, Stormville; Chorng-Lii Hwang, Wappingers Falls, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/447,631

(22) Filed: Nov. 23, 1999

(51) Int. Cl.[7] .................................................. H01L 21/8242
(52) U.S. Cl. ................................................................ 438/239
(58) Field of Search ..................................... 438/210, 238, 438/239, 240, 243, 381, 396, 397, 253, 244

(56) References Cited

U.S. PATENT DOCUMENTS 6,015,986 * 1/2000 Shuegraf ............................. 257/303
6,049,103 * 4/2000 Horikawa et al. ................. 257/303
6,051,858 * 4/2000 Uchida et al. ..................... 257/295

* cited by examiner

Primary Examiner—David Nelms
Assistant Examiner—David Nhu
(74) Attorney, Agent, or Firm—Eric W. Petraske

(57) ABSTRACT

The difficulty of etching noble metals in ferroelectric capacitors is eliminated by a damascene process that employs chemical-mechanical polishing to remove the unwanted material, resulting in a lower electrode formed in an aperture in a dielectric, having a flat central portion and a wall extending from the central portion to the top surface of the surrounding dielectric; and an upper electrode formed in a two-level aperture, so that the upper electrode structure has a flat central portion, a first vertical wall extending from the central portion to a rim surrounding the central portion and extending over the wall of the lower electrode, and a second vertical wall extending from the rim to the top surface of a surrounding dielectric.

8 Claims, 4 Drawing Sheets

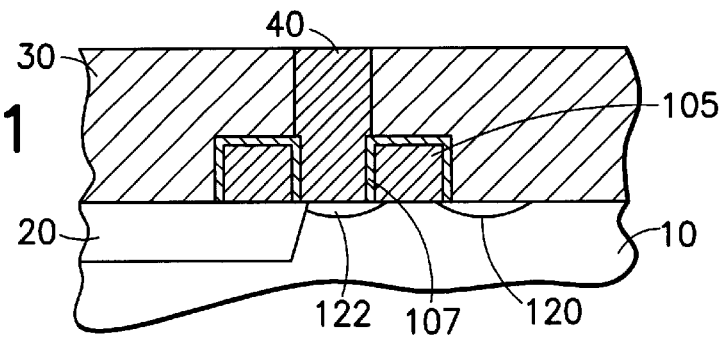
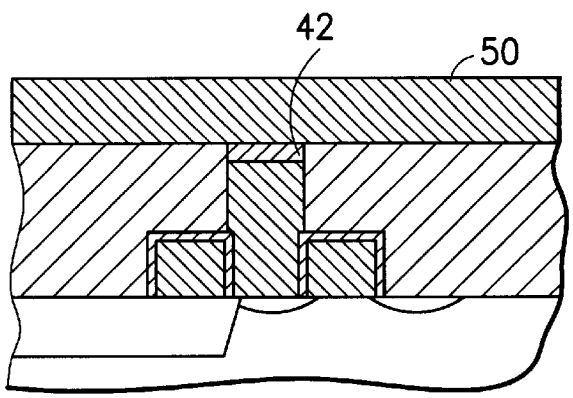
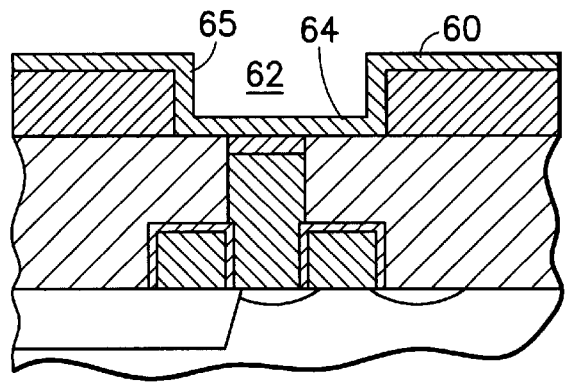
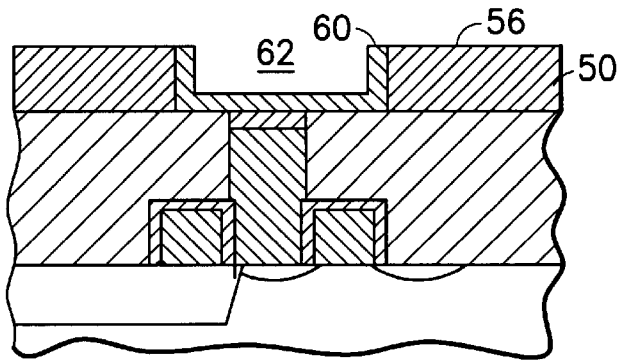

US 6,238,963 B1

DAMASCENE PROCESS FOR FORMING FERROELECTRIC CAPACITORS

TECHNICAL FIELD

The field of the invention is that of forming capacitors in integrated circuits, in particular ferroelectric capacitors having noble metals as electrodes.

BACKGROUND OF THE INVENTION

Ferroelectric dielectrics such as barium strontium titanate (BST) have been suggested as capacitor dielectrics (DRAM storage capacitors or coupling capacitors in general circuits) in submicron integrated circuits because of their high dielectric constant. In addition, materials such as lead zirconium titanate (PZT) or strontium bismuth tantalate (SBT) that can store charge permanently may be used for non-volatile memories.

Their chemical properties, e.g. reactive nature, require that they be used with noble metals such as Pt or Ir.

These metals, however, are difficult to process by conventional reactive ion (dry) etching.

SUMMARY OF THE INVENTION

The invention relates to a method of forming the elements of a ferroelectric capacitor that avoids etching the noble-metal electrodes by using a damascene process and chemical-mechanical polishing to remove material outside the damascene aperture. A feature of the invention is the formation of a lower electrode in a first supporting dielectric, having a flat central portion and outer vertical walls extending to the top of the first supporting dielectric, over which a ferroelectric dielectric is deposited in a larger upper aperture, formed in a second supporting dielectric, so that the ferroelectric dielectric extends outwardly over the top of the lower electrode walls along the upper surface of the first supporting dielectric to an outer wall of the upper aperture. The result of this structure is that the upper electrode has a flat central portion over the lower electrode and a rim extending outwardly past the central portion. A lower wall connects the central portion to the rim and an upper wall extends upwardly from the rim to the top surface of the second supporting dielectric.

BRIEF DESCRIPTION OF THE DRAWINGS

FIGS. 1–8 illustrate steps in the formation of a capacitor according to the invention.

DESCRIPTION OF THE PREFERRED EMBODIMENTS

Ferroelectric capacitors in DRAMS and in non-volatile memories (FRAMS) have become popular because of their ability to provide a small footprint, which is increasingly important as dimensions become smaller. Unfortunately, ferroelectric caps employing multicomponent oxide such as PZT, SBT or BST require the use of "noble" metals as electrodes, e.g. elements such as Pt, Ir, or Ru.

These metals are difficult to etch in a standard dry etch process because they have low chemical reactivity, low volatility and low sputtering yields. The results of etching are typically high density of residue, and non-vertical profiles on the sides of an etched area.

Figure 10A:
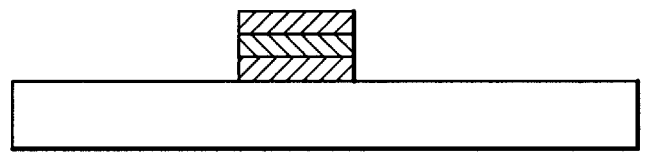
FIGS. 10-A–10-B illustrate a prior art method.
Figure 10B:
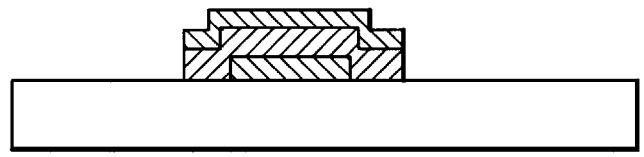

In the prior art, processes indicated in FIG. 10A–10B have been used. In FIG. 10-A, all three components, top electrode, dielectric and lower electrode are patterned at the same time in a dry etch (or reactive ion etching, RIE). In FIG. 10-B, the lower electrode is patterned first and the dielectric and upper electrodes are patterned later with a different mask.

Referring now to FIG. 1, a portion of a DRAM cell is shown in which substrate 10 has a transfer transistor with gate 105 and insulator 107 above source and drain 120 and 122. On the left of the figure, isolation 20 separates the cell from adjacent elements. In the center, lower contact plug 40 connects source 122 and what will become the bottom electrode. On the left, above isolation 20 there is a block that represents a passing wordline that will connect to another cell(s) in a plane behind the plane shown. This layout feature is not required for the present invention and other layout schemes could be used.

Interlayer dielectric (oxide) layer 30 encapsulates the transistor and plug. Connections to drain 120 and to gate 105 are behind the plane of the drawing and are not shown for simplicity.

Next, in FIG. 2, a barrier layer 42, illustratively of TaN, TiN, or TaSiN, and having a thickness of 150 nm is formed above plug 40 to prevent migration of oxygen from the lower electrode down to the contact plug 40, which would oxidize the plug. Oxide 50 has been deposited to form the surrounding material for the capacitor to a nominal thickness of 100 nm to 1000 nm. This thickness will determine the vertical surface area.

In FIG. 3, aperture 62 has been formed in oxide layer 50 and a layer of Pt 60 (100 nm thick) has been put down in a conventional process (such as sputtering or CVD) that will become the lower electrode of the capacitor. Advantageously, this configuration of the lower electrode reduces oxidation of the plug because the path along the interface between the lower electrode and the surrounding dielectric (along wall 65 and bottom 64 in FIG. 3) is longer than a corresponding path in a typical prior art configuration shown in FIG. 10.

Figure 5:
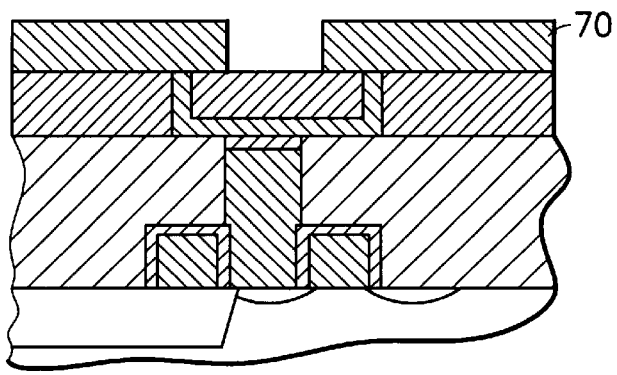
Figure 6:
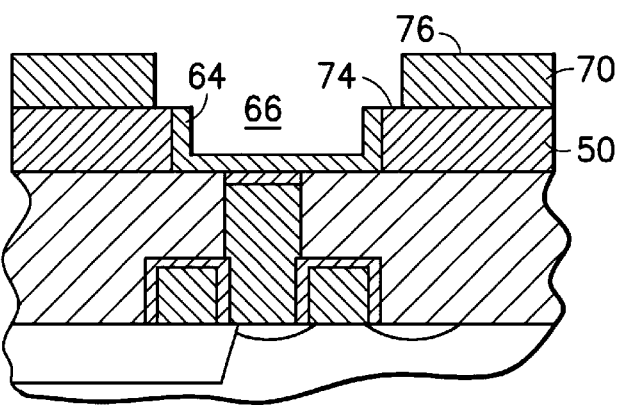

FIG. 4 shows the result of a conventional chemical-mechanical polishing (CMP) operation that removes the Pt outside aperture 62. FIG. 5 shows the result of depositing a second dielectric (illustratively CVD oxide) layer 70 that is etched out with a second lithography step and RIE, leaving the structure shown in FIG. 6 to form a two-level aperture 66 that will define the ferroelectric dielectric. The use of two levels cures a problem of shorting out the two electrodes that was present in the alternative structure of FIG. 11 and becomes worse as dimensions shrink. If a top plug 97' is applied to the structure of FIG. 11, it is evident that misalignment will cause the plug to short the two electrodes 90 and 60. With the structure of FIG. 9, there is no possibility that plug 97 will contact the lower electrode.

Figure 7:
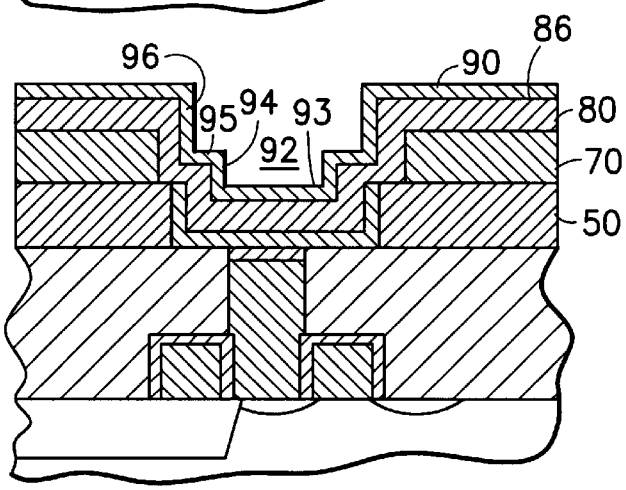

FIG. 7 shows the result of depositing the dielectric 80, illustratively PZT (50 nm thick) and the upper electrode 90, illustratively Pt (100 nm thick).

Figure 8:
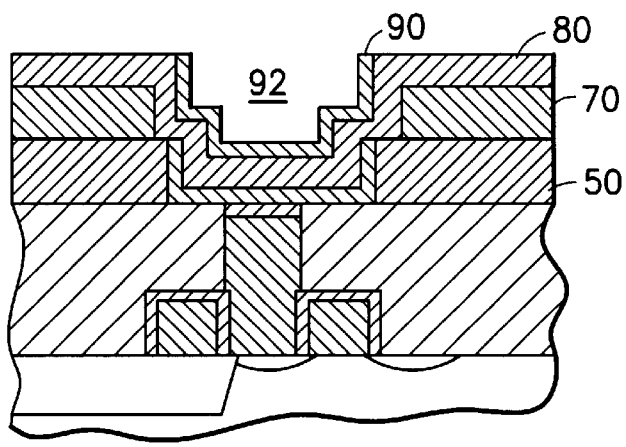

A second conventional CMP operation, the result of which is shown in FIG. 8, removes the upper electrode and ferroelectric dielectric outside aperture 92.

To summarize the method, a first aperture 62 is formed in a first supporting dielectric 50 to hold the lower electrode 60, which is removed outside the first aperture by CMP, leaving a flat lower electrode portion 64 and vertical lower electrode walls 65 extending up to the top surface 56 of the first supporting dielectric. A second layer of supporting dielectric 70 fills the lower aperture. The second supporting dielectric 70 is removed to expose the lower electrode 60 and to form an upper aperture 66 larger than the lower electrode, having a horizontal step 74 extending outwardly over the lower electrode walls 65. The ferroelectric dielectric layer 80 is deposited over the lower electrode in the lower aperture (and continuing in the rest of the upper aperture), thereby forming a dielectric step extending over the lower electrode walls and over the top surface 56 of the first supporting dielectric. The ferroelectric dielectric continues up through the upper aperture and over the top surface 76 of the second supporting dielectric. The upper electrode is deposited over the ferroelectric dielectric, having a flat central portion 93, an inner upper electrode vertical wall 94 parallel to the lower electrode walls, a horizontal electrode step 95 extending over the dielectric step 74 at the shelf of the upper aperture and an outer upper electrode wall 96 extending to the top surface 86 of the ferroelectric dielectric. A CMP step removes the upper electrode and the ferroelectric dielectric down to the top surface 76 of the second supporting dielectric, leaving an upper electrode having a central flat portion 93 above the flat lower electrode portion 64, a first upper electrode wall 94 extending from the flat portion 93 to the upper electrode shelf 95, the upper electrode shelf 95 extending over the lower electrode wall to a second upper electrode wall 96 extending from the upper electrode shelf to the top surface 76 of the second supporting dielectric.

Figure 9:
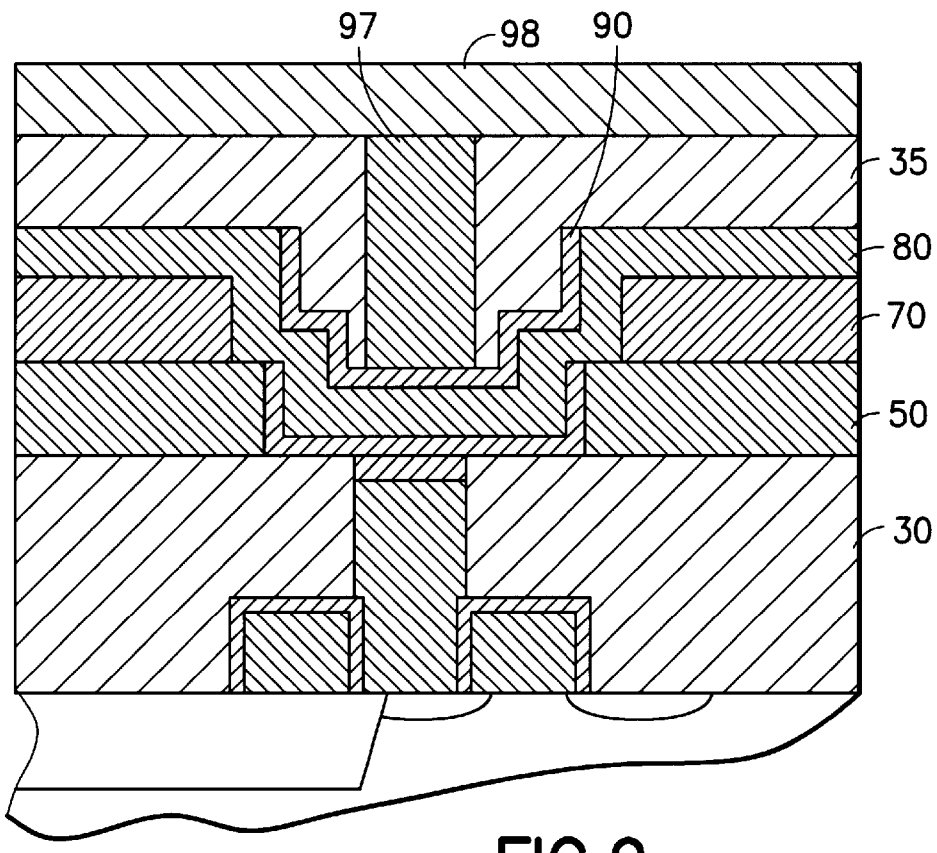
FIG. 9 illustrates the capacitor structure.

The final structure is shown in FIG. 9, with upper electrode 90 having a lower central portion 93, a rim 95 connected to the lower central portion by first upper electrode walls 94 and second vertical walls 96. An upper plug 97 connects upper electrode 90 with conventional interconnect 98. Varying the thickness of layer 50 will change the total surface area of the capacitor.

In the case when the thickness T1 of layer 50 is equal to the thickness of lower electrode 60, lower walls 65 are polished away. The same applies to thickness t2 of layer 70—when it is equal to the combined thickness of dielectric 80 and electrode 90, walls 96 disappear.

Figure 11:
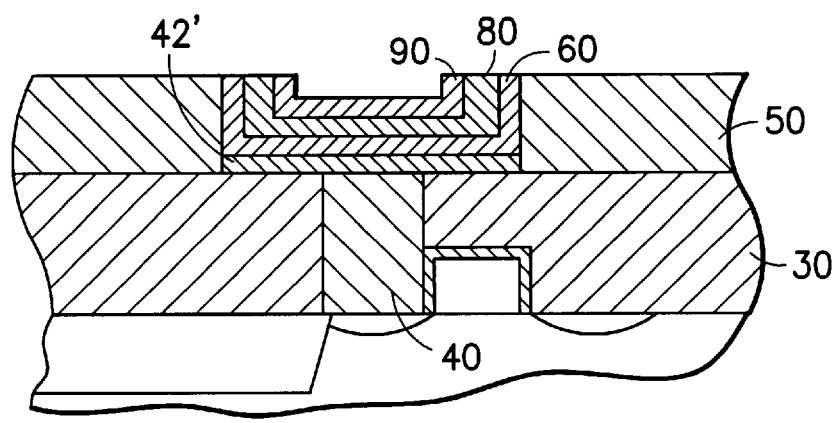
FIG. 11 illustrates an alternative structure.

An alternative structure is shown in FIG. 11, omitting dielectric 70 and thereby producing a flatter structure. This simpler structure will cause more shorting of the two electrodes by an upper contact, as described above. Making the upper electrode wide enough to allow for tolerance in upper plug position would consume an unacceptably large area.

The invention produces several advantages - yield improvement as a result of dispensing with the RIE steps; density improvement since the layers are essentially self-aligned; the opportunity to manipulate the 3-dimensional structure by varying the relationship between the thickness of the dielectric layers 50, 70, and 80. In addition, there is no concern with damage from the plasma in a RIE process. The improved vertical profile control makes scaling to smaller dimensions easier while avoiding shorts.

Figure 12:
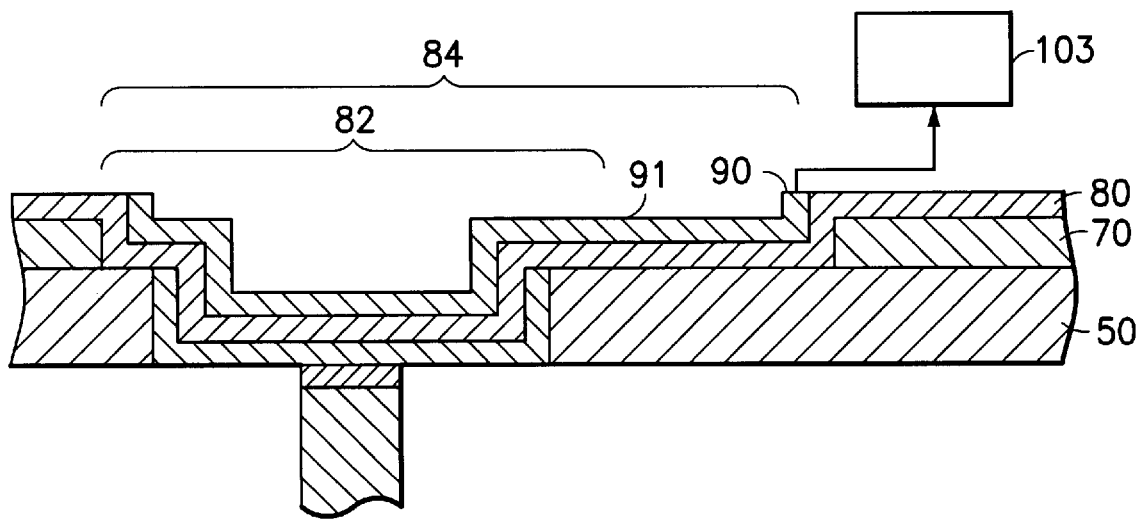
FIG. 12 illustrates an alternative embodiment of the invention.

An optional feature of the invention is illustrated in FIG. 12, showing the use of an extended upper electrode as a local interconnect member. This is accomplished by changing the mask used to pattern dielectric 70 to form the aperture in which ferroelectric dielectric 80 is deposited. In the figure, bracket 82 shows the dimension of the aperture perpendicular to the plane of the paper. In previous figures, the aperture was preferably the same in the plane and perpendicular to it. In this embodiment, bracket 84 shows the dimension in the plane of the paper. With such an extension, contact can easily be made to interconnect member 91. Alternatively, the mask can be made such that interconnect member 91 travels in the plane or perpendicular to the plane of the paper to meet another capacitor or another circuit element. Box 103 represents schematically the remainder of the circuit containing the capacitor.

Preferably, the horizontal distance between electrodes 60 and 90 at the top of layer 50 is the same as the vertical distance between the same electrodes, so that the electric field between the electrodes is about the same. Exact equality of these distances is not required because this structure has the advantage of being less prone to pinholes due to local thinning because corners at the bottom of the aperture (according to the invention) are thicker than corners at a shoulder (as is done in the prior art).

Alternative techniques, such as lift-off techniques for removing the metal outside the aperture, to reduce the amount of CMP required may be advantageous, subject to the usual tradeoffs.

The deposition and CMP techniques are conventional and well known to those skilled in the art.

While the invention has been described in terms of a single preferred embodiment, those skilled in the art will recognize that the invention can be practiced in various versions within the spirit and scope of the following claims.

We claim:

1. A method of forming a capacitor in an integrated circuit comprising the steps of:

forming a first aperture in a first surrounding dielectric layer above a lower contact element;

depositing a first electrode layer in said first aperture;

depositing a capacitor dielectric layer above said first electrode layer;

depositing a second electrode layer above said capacitor dielectric layer; and removing said first electrode layer, said capacitor dielectric layer, and said second electrode layer outside said first aperture by at least one step of CMP, without the use of reactive ion etching.

2. A method according to claim 1, in which a first CMP step is performed after said step of depositing a first electrode layer to remove that portion of said first electrode layer outside said first aperture, leaving a first electrode within said first aperture.

3. A method according to claim 2, further comprising the steps of depositing a second surrounding dielectric layer above said first surrounding dielectric layer and forming a second aperture including said first aperture in said second surrounding dielectric layer before said step of depositing a capacitor dielectric layer and said step of depositing a second electrode layer above said capacitor dielectric layer, whereby said capacitor dielectric layer extends over said first electrode layer.

4. A method according to claim 3, further comprising a second CMP step stopping on a top surface of said second surrounding dielectric layer, whereby said first electrode is entirely covered by said capacitor dielectric layer.

5. A method according to claim 3, in which said second aperture has an aperture extension in a first direction, said aperture extension extending away from said second aperture, whereby that portion of said second electrode layer disposed in said aperture extension forms an interconnect member.

6. A method according to claim 1, further comprising the steps of:

forming at least one additional aperture aligned with said first aperture for receiving at least one of said capacitor dielectric and said second electrode; and removing said capacitor dielectric layer, and said second electrode layer outside said at least one additional aperture by at least one step of CMP.

7. A method according to claim 6, in which a second aperture of said at least one additional aperture extends past said first aperture in all directions, whereby said capacitor dielectric extends past said first electrode.

8. A method according to claim 6, further comprising the steps of:

forming second and third additional apertures aligned with said first aperture for receiving said capacitor dielectric and said second electrode, respectively; and removing said capacitor dielectric layer, and said second electrode layer outside said second aperture and said third aperture by CMP.

* * * * *